United States Patent
Kim et al.

(10) Patent No.: US 9,601,435 B2
(45) Date of Patent: Mar. 21, 2017

(54) SEMICONDUCTOR PACKAGE WITH EMBEDDED COMPONENTS AND METHOD OF MAKING THE SAME

(71) Applicant: QUALCOMM Incorporated, San Diego, CA (US)

(72) Inventors: Chin-Kwan Kim, San Diego, CA (US); David Fraser Rae, San Diego, CA (US); Rajneesh Kumar, San Diego, CA (US); Milind Pravin Shah, San Diego, CA (US); Omar James Bchir, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/603,166

(22) Filed: Jan. 22, 2015

(65) Prior Publication Data

US 2016/0218064 A1 Jul. 28, 2016

(51) Int. Cl.
*H01L 23/48* (2006.01)
*H01L 23/538* (2006.01)
(Continued)

(52) U.S. Cl.
CPC .......... *H01L 23/5389* (2013.01); *H01L 23/13* (2013.01); *H01L 23/5385* (2013.01); *H01L 24/29* (2013.01); *H01L 24/92* (2013.01); *H01L 24/97* (2013.01); *H01L 25/0655* (2013.01); *H01L 25/16* (2013.01); *H01L 25/18* (2013.01); *H01L 25/50* (2013.01); *H01L 23/5384* (2013.01); *H01L 23/5386* (2013.01); *H01L 24/16* (2013.01); *H01L 24/32* (2013.01); *H01L 24/81* (2013.01); *H01L 24/83* (2013.01); *H01L 2224/16227* (2013.01); *H01L 2224/29006* (2013.01); *H01L 2224/29007* (2013.01); *H01L 2224/32105* (2013.01);
(Continued)

(58) Field of Classification Search
CPC . H01L 23/5389; H01L 23/5386; H01L 23/13; H01L 24/32; H01L 24/83; H01L 25/0655; H01L 25/16; H01L 25/18; H01L 25/50
See application file for complete search history.

(56) References Cited

U.S. PATENT DOCUMENTS 5,840,215 A * 11/1998 Iyer ........................... C09J 9/02
156/247
6,746,914 B2  6/2004 Kai et al.
(Continued)

*Primary Examiner* — Nicholas Tobergte
(74) *Attorney, Agent, or Firm* — Muncy, Geissler, Olds & Lowe, P.C.

(57) ABSTRACT

A semiconductor package may include a lower substrate with one or more electronic components attached to a surface thereof and an upper substrate with one or more cavities wherein the upper substrate is attached to the lower substrate at a plurality of connection points with the one or more electronic components fitting within a single cavity or a separate cavity for each component that allow the overall form factor of the semiconductor package to remain smaller. The plurality of connection points provide a mechanical and electrical connection between the upper and lower substrate and may include solder joints there between as well as conductive filler particles that create an adhesive reinforcement matrix when compressed for assembly.

14 Claims, 9 Drawing Sheets

(51) Int. Cl.
  *H01L 25/00* (2006.01)
  *H01L 25/065* (2006.01)
  *H01L 25/18* (2006.01)
  *H01L 25/16* (2006.01)
  *H01L 23/13* (2006.01)
  *H01L 23/00* (2006.01)

(52) U.S. Cl.
  CPC ........... *H01L 2224/32106* (2013.01); *H01L 2224/32225* (2013.01); *H01L 2224/32227* (2013.01); *H01L 2224/73253* (2013.01); *H01L 2224/8385* (2013.01); *H01L 2224/83191* (2013.01); *H01L 2224/83851* (2013.01); *H01L 2224/83855* (2013.01); *H01L 2224/92* (2013.01); *H01L 2224/92225* (2013.01); *H01L 2224/97* (2013.01); *H01L 2924/14* (2013.01); *H01L 2924/1434* (2013.01); *H01L 2924/15153* (2013.01); *H01L 2924/19105* (2013.01)

(56) References Cited

U.S. PATENT DOCUMENTS

| | | | |
|---|---|---|---|
| 6,952,049 B1* | 10/2005 | Ogawa | H01G 4/232 257/678 |
| 8,793,868 B2 | 8/2014 | Yamano et al. | |
| 8,883,563 B1 | 11/2014 | Haba et al. | |
| 2002/0189091 A1* | 12/2002 | Ding | H01L 23/49833 29/840 |
| 2005/0239235 A1* | 10/2005 | Appelt | H01L 21/481 438/118 |
| 2009/0200648 A1 | 8/2009 | Graves, Jr. | |
| 2011/0011939 A1 | 1/2011 | Seah | |
| 2012/0101540 A1* | 4/2012 | O'Brien | A61B 5/0031 607/9 |

* cited by examiner

SEMICONDUCTOR PACKAGE WITH EMBEDDED COMPONENTS AND METHOD OF MAKING THE SAME

FIELD OF DISCLOSURE

This disclosure relates generally to semiconductor packages and more specifically, but not exclusively, to semiconductor packages having embedded components.

BACKGROUND

In modern semiconductor manufacturing, there is an increasing demand for putting more silicon into a smaller area. One approach is to embed a silicon die or other electronic component into the package substrate during formation of the package substrate. For example, after putting the die on one of the substrate layers, additional substrate layers are formed on top of the embedded die. However, this approach has drawbacks. Since the substrate formation process yield is relatively lower, there is high chance of losing good die that are embedded into a substrate that fails quality inspections.

Accordingly, there is a need for systems, apparatus, and methods that improve upon conventional approaches including the improved methods, system and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In some examples of the disclosure, the system, apparatus, and method includes a semiconductor package having a first electronic component mounted on a lower substrate layer; a second electronic component mounted on the lower substrate layer adjacent the first electronic component; an adhesive layer on a surface of the first electronic component and a surface of the second electronic component; an upper substrate layer having a cavity therein, the upper substrate layer attached to the lower substrate layer such that the first electronic component and the second electronic component are located within the cavity; and a plurality of connection points located between the upper substrate layer and the lower substrate layer, the plurality of connection points electrically and mechanically connecting the upper substrate layer and the lower substrate layer.

In some examples of the disclosure, the system, apparatus, and method includes a semiconductor package having a first electronic component mounted on a lower substrate layer; a second electronic component mounted on the lower substrate layer adjacent the first electronic component; an adhesive layer on a surface of the first electronic component and a surface of the second electronic component; an upper substrate layer having a first cavity and a second cavity, the upper substrate layer attached to the lower substrate layer such that the first electronic component is located in the first cavity and the second electronic component is located in the second cavity; and a plurality of connection points located between the upper substrate layer and the lower substrate layer, the plurality of connection points electrically and mechanically connecting the upper substrate layer and the lower substrate layer.

In some examples of the disclosure, the system, apparatus, and method includes a method of forming a package substrate with embedded components having the steps of mounting a first electronic component and a second electronic component on a lower substrate layer; applying an adhesive layer to a surface of the first electronic component and a surface of the second electronic component; adhering an upper substrate layer to the surface of the first electronic component and the surface of the second electronic component; and forming a plurality of connection points, the plurality of connection points electrically and mechanically connecting the upper substrate layer and the lower substrate layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
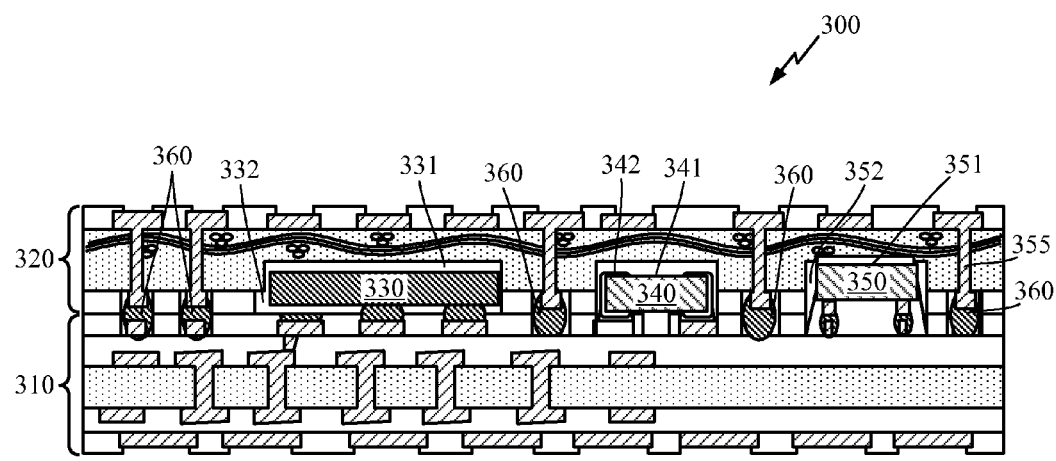
FIGS. 1A and 1B illustrate an exemplary semiconductor package and a partially exploded view of the semiconductor package in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

In some examples of the disclosure, a semiconductor package may include a lower substrate with one or more electronic components attached to a surface thereof and an upper substrate with one or more cavities wherein the upper substrate is attached to the lower substrate at a plurality of connection points with the one or more electronic components fitting within a single cavity or a separate cavity for each component that allow the overall form factor of the semiconductor package to remain smaller. The plurality of connection points provide a mechanical and electrical connection between the upper and lower substrate and may include solder joints there between as well as conductive filler particles that create an adhesive reinforcement matrix when compressed for assembly.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Figure 1B:
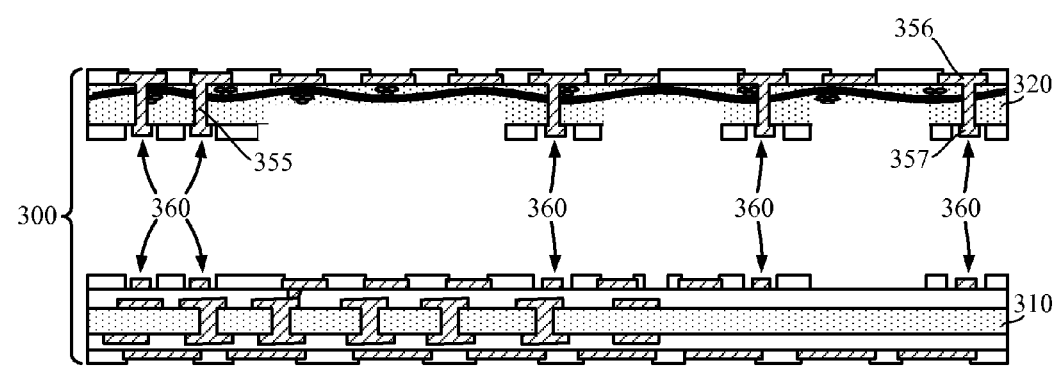

FIGS. 1A and 1B illustrate an exemplary semiconductor package and a partially exploded view of the semiconductor package in accordance with some examples of the disclosure. As shown in FIGS. 1A and 1B, a semiconductor package 300 may include a lower substrate layer 310, an upper substrate layer 320 located above the lower substrate layer 310 and attached thereto, a first electronic component 330 attached to the lower substrate layer 310, a second electronic component 340 attached to the lower substrate layer 310 and horizontally spaced from the first electronic component 330, and a third electronic component 350 attached to the lower substrate layer 310 and horizontally spaced from the first electronic component 330 and the second electronic component 340. While FIG. 1A shows three electronic components, it should be understood that more or less electronic components may be used based on the desired function of the semiconductor package. The electronic components may be any type of electronic component, such as a semiconductor die, integrated circuit, or memory. The first electronic component 330 may be located in a first cavity 331 of the upper substrate layer 320, the second electronic component 340 may be located in a second cavity 341 of the upper substrate layer 320, and the third electronic component 350 may be located in a third cavity 351 of the upper substrate layer 320. Alternatively, the electronic components may be located in the same cavity. The first electronic component 330 may include an adhesive layer 332 on an outer surface for adhering the first electronic component 330 to the first cavity 331, the second electronic component 340 may include an adhesive layer 342 on an outer surface for adhering the second electronic component 340 to the second cavity 341, and the third electronic component 350 may include an adhesive layer 352 on an outer surface for adhering the third electronic component 350 to the third cavity 351.

The lower substrate layer 310 and the upper substrate layer 320 may include a plurality of interconnections, such as electrical redistribution layers and vias that allow electrical signals to be routed within the respective substrate layer, between substrate layers, and to external points. For example, the upper substrate layer 320 may include connection vias 355 that electrically connect a top connection pad 356 to a lower connection pad 357. The lower substrate layer 310 and the upper substrate layer 320 may be attached at a plurality of connection points 360 that electrically and mechanically connect the lower substrate layer 310 and the upper substrate layer 320. Each of the plurality of connection points 360 may include a solder joint and may include an adhesive layer with conductive filler particles that form an electrically conductive adhesive reinforcement matrix when compressed. The conductive filler particles may be electrically conductive, such as copper, silver, gold, or alloys of the same.

Figure 2A:
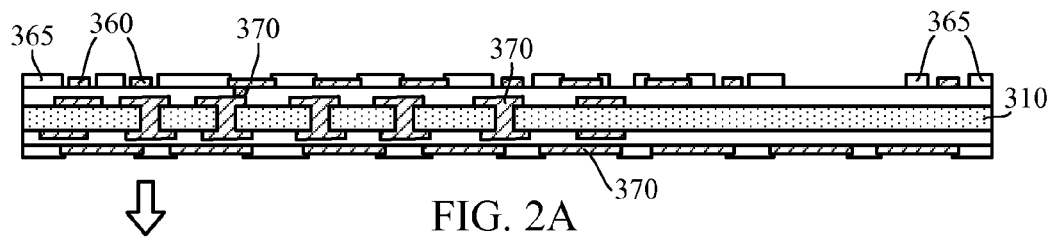
FIGS. 2A-E illustrate an exemplary partial process flow for formation of a semiconductor package in accordance with some examples of the disclosure.
Figure 2B:
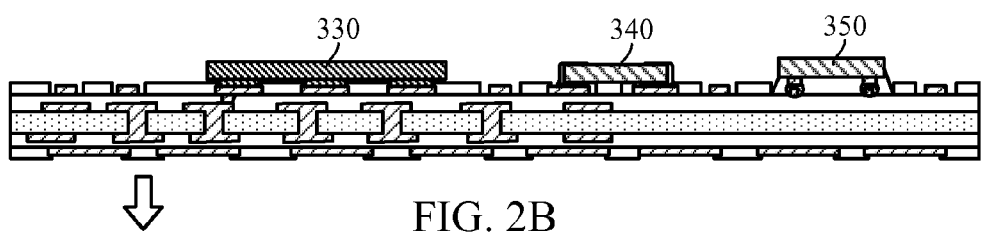

FIGS. 2A-E illustrate an exemplary partial process flow for formation of a semiconductor package in accordance with some examples of the disclosure. The partial process flow begins as shown in FIG. 2A, a lower substrate layer 310 is formed with a plurality of dielectric regions 365, a plurality of connection points 360 on a top surface, and a plurality of interconnections 370 within and on the surfaces of the lower substrate layer 310 that provide electrical connections and pathways within the substrate, between the substrates, and to external connections. The process continues in FIG. 2B with the attachment of a first electronic component 330, a second electronic component 340, and a third electronic component 350 on a top surface of the lower substrate layer 310. While FIG. 2B shows three electronic components, it should be understood that more or less electronic components may be used based on the desired function of the semiconductor package. The electronic components may be any type of electronic component, such as a semiconductor die, integrated circuit, or memory.

Figure 2C:
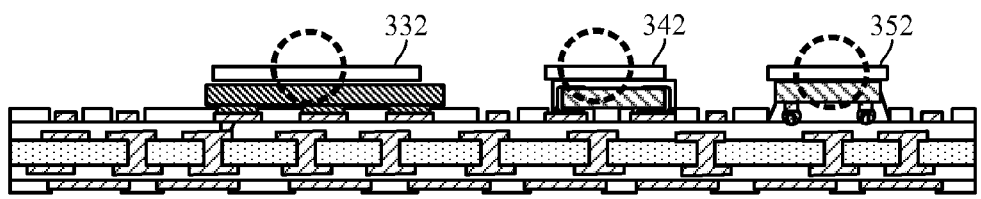
Figure 2D:
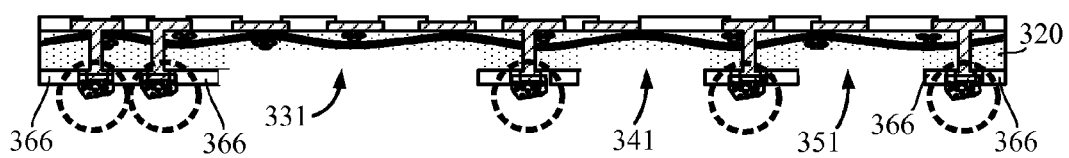
Figure 2E:
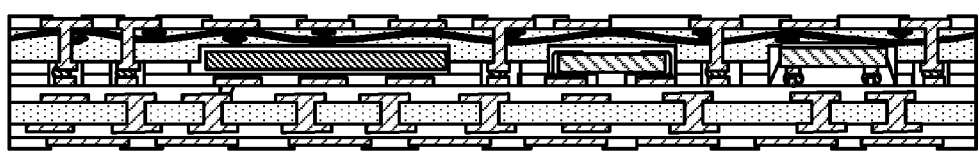

In FIG. 2C, the process flow continues with the application of an adhesive layer 332 on the first electronic component 330, an adhesive layer 342 on the second electronic component 340, and an adhesive layer 352 on the third electronic component 350. In FIG. 2D, the process flow continues with the separate formation of the upper substrate layer 320. It should be understood that the upper substrate layer 320 may be formed before or after the lower substrate layer and before or after the attachment of the electronic components and/or the application of the adhesive layers. The upper substrate layer 320 is formed with a plurality of dielectric regions 366 on each side of the plurality of connection points 360, the plurality of connection points 360 on a bottom surface, and a plurality of interconnections 371 within and on the surfaces of the upper substrate layer 320 that provide electrical connections and pathways within the substrate, between the upper substrate layer 320 and lower substrate layer 310, and to external connections. The upper substrate layer 320 may include a first cavity 331, a second cavity 341, and a third cavity 351. In addition, the plurality of connection points 360 may include a solder material and conductive filler particles for providing a mechanical and electrical connection between the upper substrate layer 320 and the lower substrate layer 310. The solder material and conductive filler particles may be embedded in an adhesive material that creates an adhesive reinforcement matrix when compressed. In FIG. 2E, the partial process flow ends with the attachment of the upper substrate layer 320 to the lower substrate layer 310.

Figure 3:
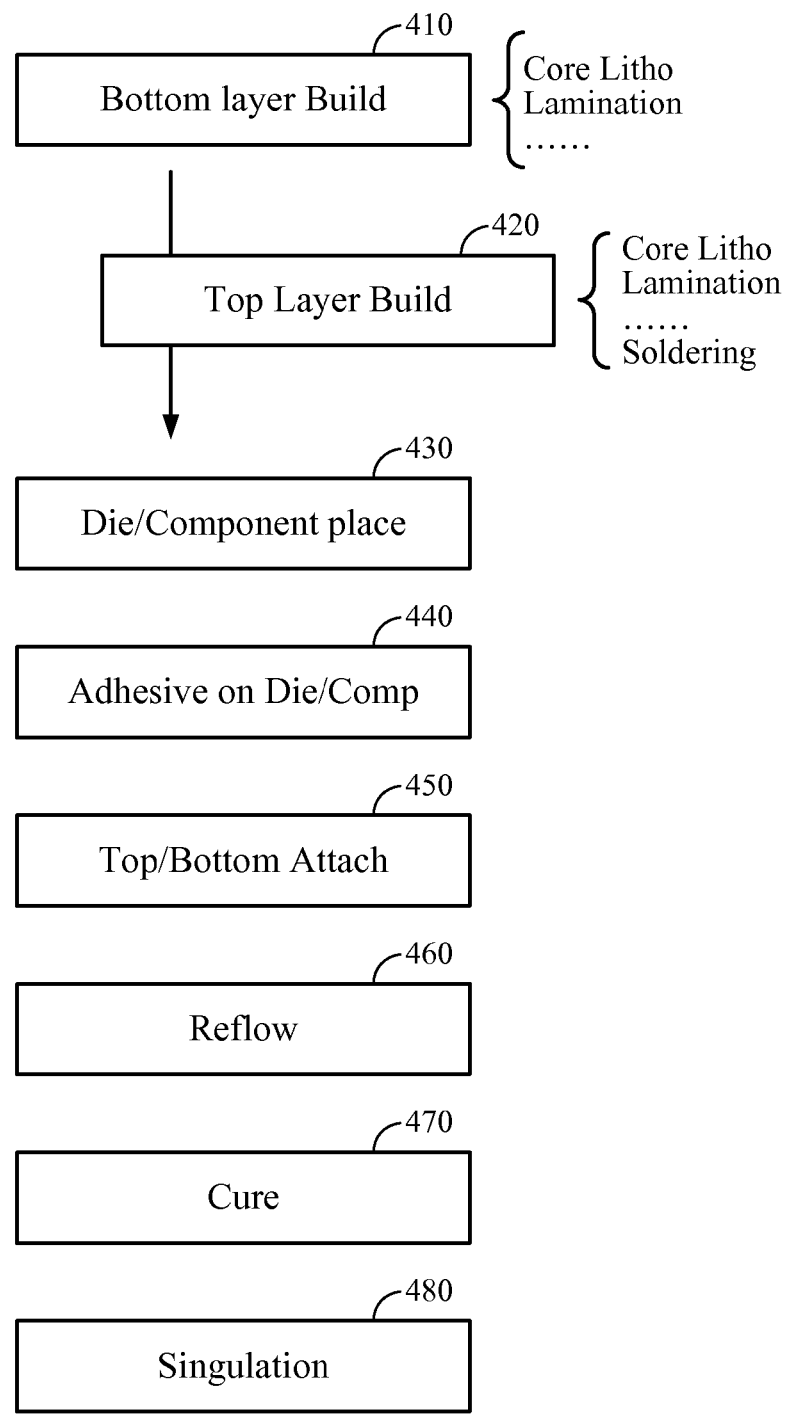
FIG. 3 illustrates an exemplary partial process flow for formation of a semiconductor package with component placement following substrate formation in accordance with some examples of the disclosure.

FIG. 3 illustrates an exemplary partial process flow for formation of a semiconductor package with component placement following substrate formation in accordance with some examples of the disclosure. As shown in FIG. 3, a bottom substrate layer is built or formed 410. This may include the steps of coring, lithographic processes, lamination, as well as other processes necessary to form the component of the bottom substrate layer. Next in 420, the top substrate layer is built or formed. This may include the steps of coring, lithographic processes, lamination, as well as soldering for the plurality of connection points on a bottom surface of the top substrate layer. Next in 430, the electronic components are placed and attached to the bottom substrate layer. Next in 440, an adhesive layer is applied to the surface of the electronic components. In 450, the top and bottom substrate layers are attached. Next in 460, a solder reflow process is applied to the plurality of connection points to mechanically and electrically attach the bottom substrate layer to the top substrate layer. Next in 470, a curing step is applied to cure the various materials attaching the two layers. And finally in 480, a singulation process is conducted to separate individual semiconductor packages for testing and use.

Figure 4A:
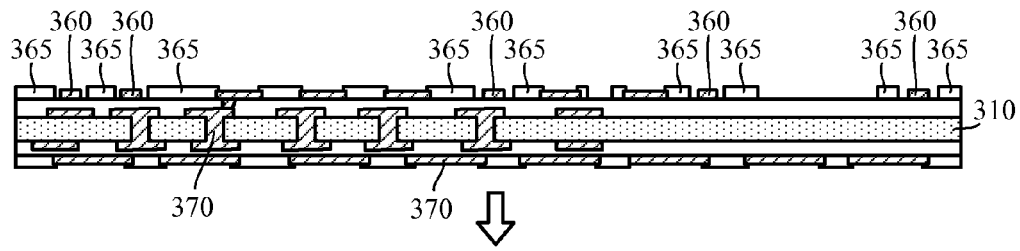
FIGS. 4A-G illustrate an exemplary partial process flow for formation of a semiconductor package using thermal compression in accordance with some examples of the disclosure.
Figure 4B:
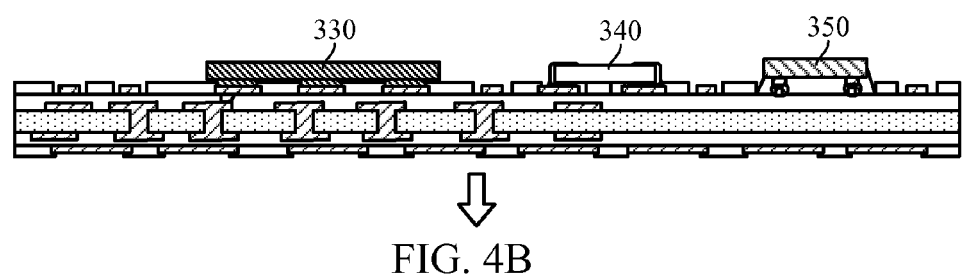

FIGS. 4A-G illustrate an exemplary partial process flow for formation of a semiconductor package using thermal compression in accordance with some examples of the disclosure. The partial process flow begins as shown in FIG. 4A, a lower substrate layer 310 is formed with a plurality of dielectric regions 365, a plurality of connection points 360 on a top surface, and a plurality of interconnections 370 within and on the surfaces of the lower substrate layer 310 that provide electrical connections and pathways within the substrate, between the substrates, and to external connections. The process continues in FIG. 4B with the attachment of a first electronic component 330, a second electronic component 340, and a third electronic component 350 on a top surface of the lower substrate layer 310. While FIG. 4B shows three electronic components, it should be understood that more or less electronic components may be used based on the desired function of the semiconductor package. The electronic components may be any type of electronic component, such as a semiconductor die, integrated circuit, or memory.

Figure 4C:
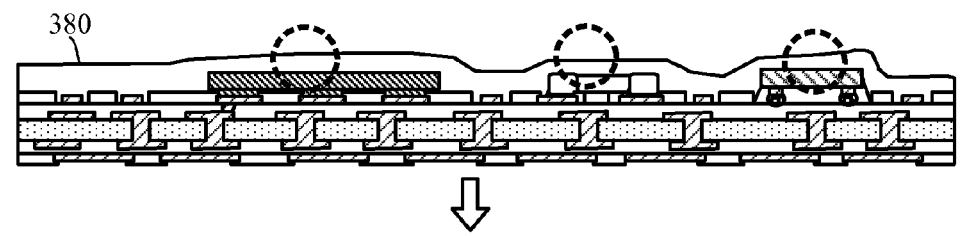
Figure 4D:
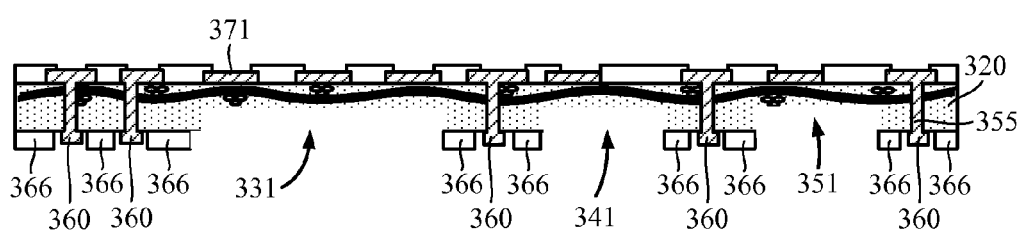
Figure 4E:
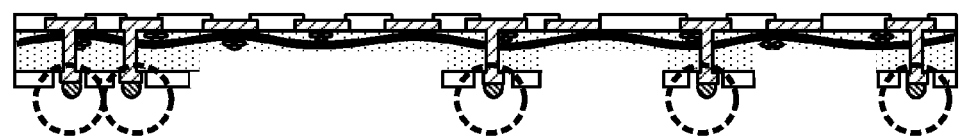
Figure 4F:
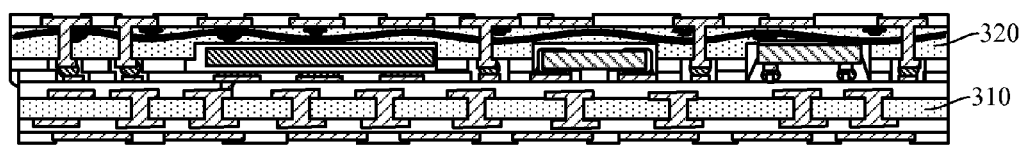
Figure 4G:
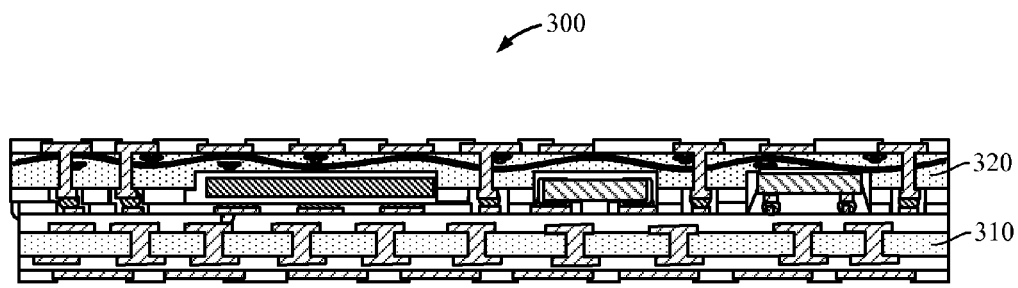

In FIG. 4C, the process flow continues with the application of an adhesive layer 380 on the surface of the lower substrate layer 310 covering the first electronic component 330, the second electronic component 340, and the third electronic component 350. In FIG. 4D, the process flow continues with the separate formation of the upper substrate layer 320. It should be understood that the upper substrate layer 320 may be formed before or after the lower substrate layer and before or after the attachment of the electronic components and/or the application of the adhesive layers. The upper substrate layer 320 is formed with a plurality of dielectric regions 366 on each side of the plurality of connection points 360, the plurality of connection points 360 on a bottom surface, and a plurality of interconnections 371 within and on the surfaces of the upper substrate layer 320 that provide electrical connections and pathways within the substrate, between the upper substrate layer 320 and lower substrate layer 310, and to external connections. The upper substrate layer 320 may include a first cavity 331, a second cavity 341, and a third cavity 351. In FIG. 4E, a solder material is applied to the plurality of connection points 360 for providing a mechanical and electrical connection between the upper substrate layer 320 and the lower substrate layer 310. In FIG. 4F, the partial process flow continues with the attachment of the upper substrate layer 320 to the lower substrate layer 310. In FIG. 4G, the partial process flow ends with the application of a solder reflow process and a curing process to secure the upper substrate layer 320 to the lower substrate layer 310 to form a semiconductor package 300.

Figure 5A:
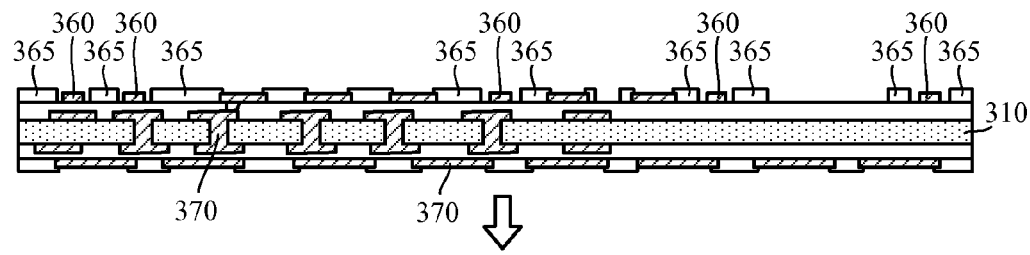
FIGS. 5A-F illustrate an exemplary partial process flow for formation of a semiconductor package using conductive adhesive in accordance with some examples of the disclosure.
Figure 5B:
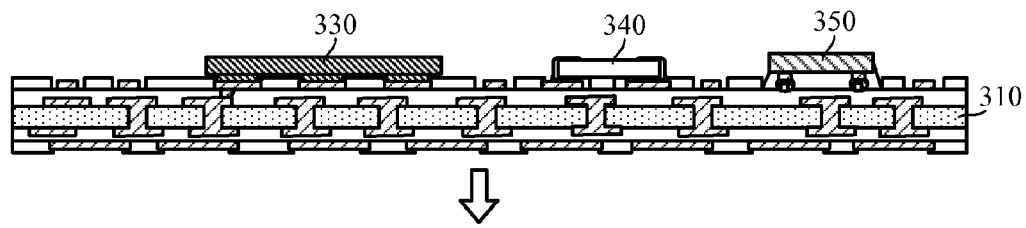

FIGS. 5A-F illustrate an exemplary partial process flow for formation of a semiconductor package using conductive adhesive in accordance with some examples of the disclosure. The partial process flow begins as shown in FIG. 5A, a lower substrate layer 310 is formed with a plurality of dielectric regions 365, a plurality of connection points 360 on a top surface, and a plurality of interconnections 370 within and on the surfaces of the lower substrate layer 310 that provide electrical connections and pathways within the substrate, between the substrates, and to external connections. The process continues in FIG. 5B with the attachment of a first electronic component 330, a second electronic component 340, and a third electronic component 350 on a top surface of the lower substrate layer 310. While FIG. 5B shows three electronic components, it should be understood that more or less electronic components may be used based on the desired function of the semiconductor package. The electronic components may be any type of electronic component, such as a semiconductor die, integrated circuit, or memory.

Figure 5C:
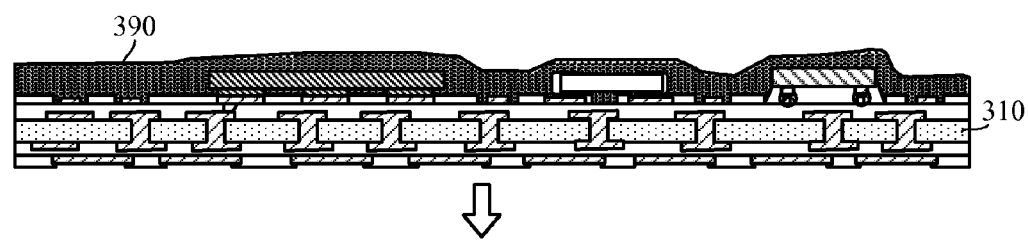
Figure 5D:
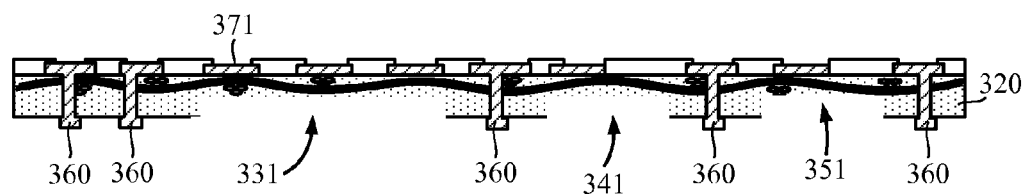
Figure 5E:
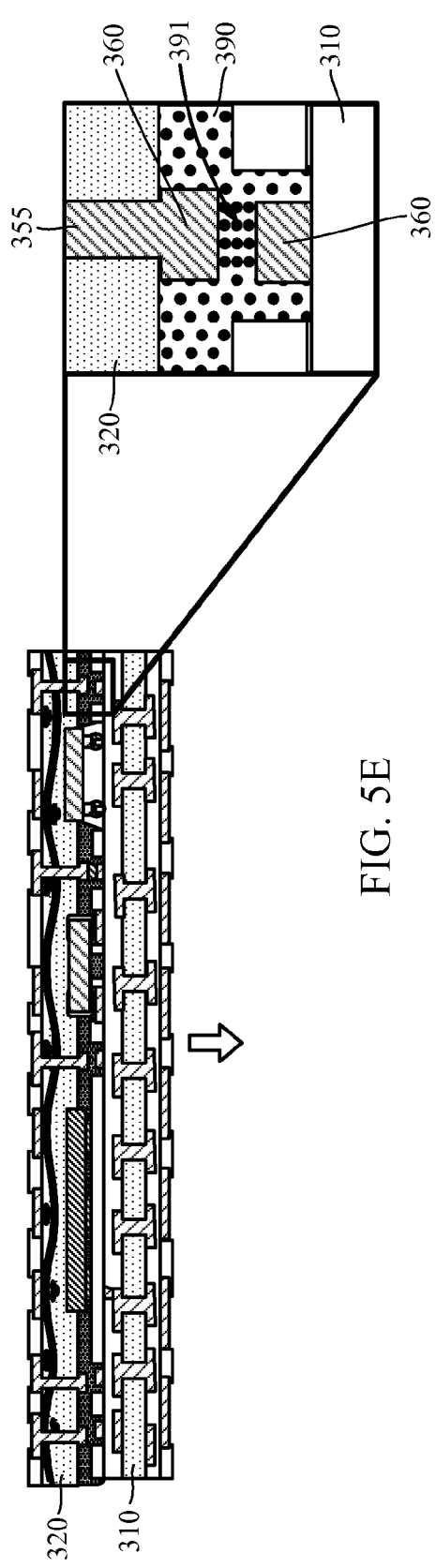
Figure 5F:
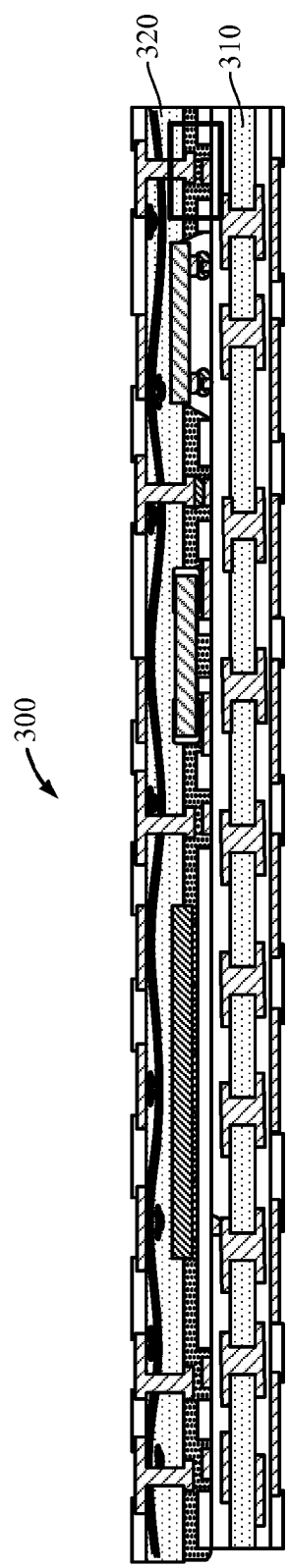

In FIG. 5C, the process flow continues with the application of an anisotropic conductive adhesive layer 390 on the surface of the lower substrate layer 310 covering the first electronic component 330, the second electronic component 340, and the third electronic component 350. In FIG. 5D, the process flow continues with the separate formation of the upper substrate layer 320. It should be understood that the upper substrate layer 320 may be formed before or after the lower substrate layer and before or after the attachment of the electronic components and/or the application of the adhesive layer. The upper substrate layer 320 is formed with a plurality of connection points 360 on a bottom surface, and a plurality of interconnections 371 within and on the surfaces of the upper substrate layer 320 that provide electrical connections and pathways within the substrate, between the upper substrate layer 320 and lower substrate layer 310, and to external connections. The upper substrate layer 320 may include a first cavity 331, a second cavity 341, and a third cavity 351. In FIG. 5E, the partial process flow continues with the attachment of the upper substrate layer 320 to the lower substrate layer 310 and the application of a thermal compression technique. As can be seen, the conductive filler material in the anisotropic conductive adhesive layer 390 forms an adhesive reinforcement matrix 391 between each of the plurality of connection points 360 of the upper substrate layer 320 and each of the plurality of connection points 360 of the lower substrate layer 310 that mechanically and electrically couple the upper substrate layer 320 to the lower substrate layer 310. In FIG. 5F, the partial process flow ends with the application of a curing process to secure the upper substrate layer 320 to the lower substrate layer 310 to form a semiconductor package 300.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 6:
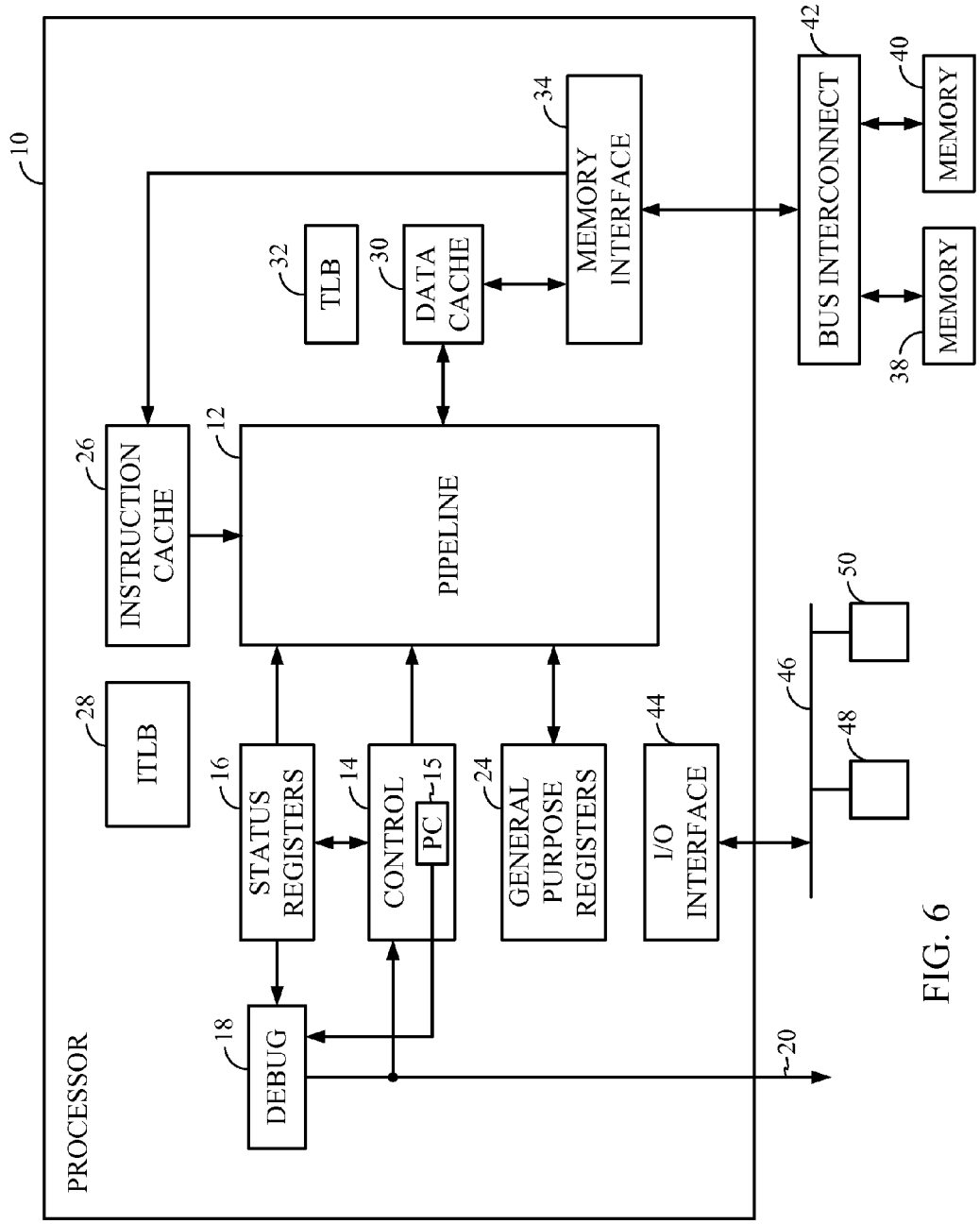
FIG. 6 illustrates an exemplary processor in accordance with some examples of the disclosure.

FIG. 6 depicts a functional block diagram of an exemplary processor 10, such as an ASIC 208 (see below). Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some examples, pipeline 12 may be a superscalar design, with multiple, parallel pipelines. Pipeline 12 may also be referred to as an execution unit. A General Purpose Register (GPR) file 20 provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various examples, ITLB 28 may comprise a copy of part of TLB 32. Alternatively, ITLB 28 and TLB 32 may be integrated. Similarly, in various examples of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master input to a bus interconnect 42 implementing a shared bus to one or more memory devices 38, 40 that may incorporate the improved data decompression in accordance with some examples of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular example. Other functional blocks that may reside in processor 10, such as a JTAG controller, instruction pre-decoder, branch target address cache, and the like are not germane to a description of the present disclosure, and are omitted for clarity.

Figure 7:
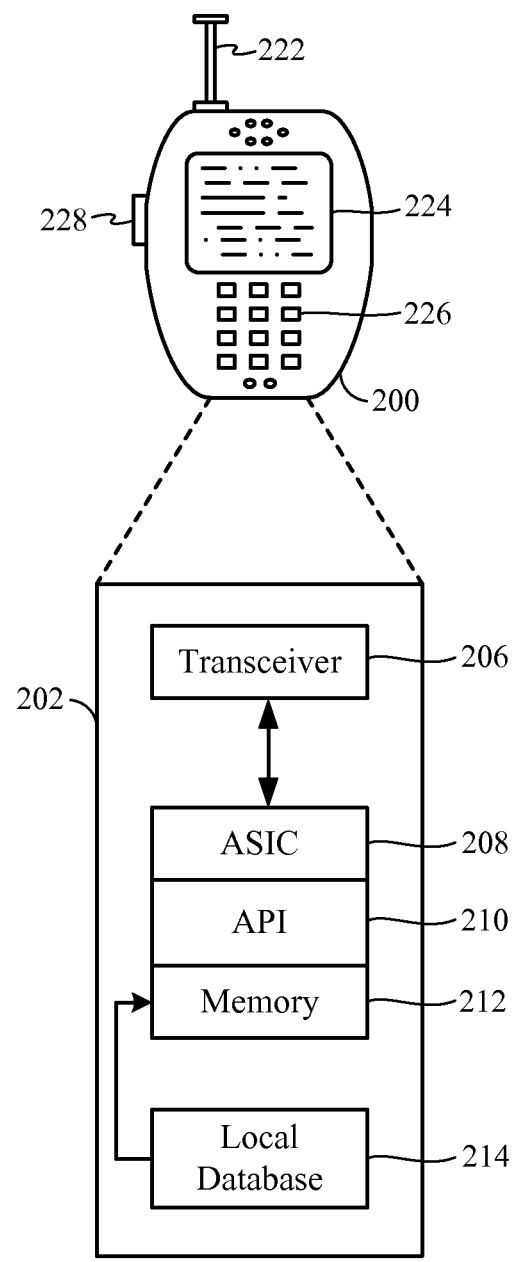
FIG. 7 illustrates exemplary user equipment (UE) in accordance with some examples of the disclosure.

Referring to FIG. 7, a system 100 that includes a UE 200, (here a wireless device), such as a cellular telephone, which has a platform 202 that can receive and execute software applications, data and/or commands transmitted from a radio access network (RAN) that may ultimately come from a core network, the Internet and/or other remote servers and networks. Platform 202 can include transceiver 206 operably coupled to an application specific integrated circuit ("ASIC" 208), or other processor, microprocessor, logic circuit, or other data processing device. ASIC 208 or other processor executes the application programming interface ("API") 210 layer that interfaces with any resident programs in memory 212 of the wireless device. Memory 212 can be comprised of read-only or random-access memory (RAM and ROM), EEPROM, flash cards, or any memory common to computer platforms. Platform 202 also can include local database 214 that can hold applications not actively used in memory 212. Local database 214 is typically a flash memory cell, but can be any secondary storage device as known in the art, such as magnetic media, EEPROM, optical media, tape, soft or hard disk, or the like. Internal platform 202 components can also be operably coupled to external devices such as antenna 222, display 224, push-to-talk button 228 and keypad 226 among other components, as is known in the art.

Accordingly, an example of the disclosure can include a UE including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of UE 200 in FIG. 7 are to be considered merely illustrative and the disclosure is not limited to the illustrated features or arrangement.

The wireless communication between UE 200 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A semiconductor package, comprising:
   a first electronic component mounted on a lower substrate layer;
   a second electronic component mounted on the lower substrate layer adjacent the first electronic component;
   an adhesive layer on a surface of the first electronic component and a surface of the second electronic component;
   an upper substrate layer having a cavity therein, the upper substrate layer attached to the lower substrate layer such that the first electronic component and the second electronic component are located within the cavity, wherein the adhesive layer is on a surface of the lower substrate layer and extends between the lower substrate layer and the upper substrate layer; and
   a plurality of connection points located between the upper substrate layer and the lower substrate layer, the plurality of connection points electrically and mechanically connecting the upper substrate layer and the lower substrate layer.

2. The semiconductor package of claim 1, wherein the first electronic component is one of a semiconductor die, a memory, or an integrated circuit and wherein the second electronic component is one of a semiconductor die, a memory, or an integrated circuit.

3. The semiconductor package of claim 1, wherein the plurality of connection points include a solder material.

4. The semiconductor package of claim 1, further comprising an anisotropic conductive adhesive between the plurality of connection points, the anisotropic conductive adhesive containing conductive filler particles.

5. The semiconductor package of claim 4, wherein the conductive filler particles comprises one of copper, silver, gold, or alloys of the same.

6. The semiconductor package of claim 5, further comprising a plurality of upper substrate layer interconnections in the upper substrate layer and a plurality of lower substrate layer interconnections in the lower substrate layer.

7. The semiconductor package of claim 1, wherein the semiconductor package is integrated into one of a mobile phone, a mobile communication device, a pager, a personal digital assistant, a personal information manager, a mobile hand-held computer, a laptop computer, a wireless device, or a wireless modem.

8. A semiconductor package, comprising:
a first electronic component mounted on a lower substrate layer;
a second electronic component mounted on the lower substrate layer adjacent the first electronic component;
an adhesive layer on a surface of the first electronic component and a surface of the second electronic component;
an upper substrate layer having a first cavity and a second cavity, the upper substrate layer attached to the lower substrate layer such that the first electronic component is located in the first cavity and the second electronic component is located in the second cavity, wherein the adhesive layer is on a surface of the lower substrate layer and extends between the lower substrate layer and the upper substrate layer; and
a plurality of connection points located between the upper substrate layer and the lower substrate layer, the plurality of connection points electrically and mechanically connecting the upper substrate layer and the lower substrate layer.

9. The semiconductor package of claim 8, wherein the first electronic component is one of a semiconductor die, a memory, or an integrated circuit and wherein the second electronic component is one of a semiconductor die, a memory, or an integrated circuit.

10. The semiconductor package of claim 8, wherein the plurality of connection points include a solder material.

11. The semiconductor package of claim 8, wherein the adhesive layer comprises an anisotropic conductive adhesive containing conductive filler particles.

12. The semiconductor package of claim 11, wherein the conductive filler particles comprises one of copper, silver, gold, or alloys of the same.

13. The semiconductor package of claim 12, further comprising a plurality of upper substrate layer interconnections in the upper substrate layer and a plurality of lower substrate layer interconnections in the lower substrate layer.

14. The semiconductor package of claim 13, wherein the semiconductor package is integrated into one of a mobile phone, a mobile communication device, a pager, a personal digital assistant, a personal information manager, a mobile hand-held computer, a laptop computer, a wireless device, or a wireless modem.

* * * * *